(12) United States Patent  (10) Patent No.: US 9,354,478 B2
Hao et al.  (45) Date of Patent: May 31, 2016

(54) DISPLAY SUBSTRATE AND METHOD OF MANUFACTURING THE SAME, AND DISPLAY DEVICE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Xueguang Hao, Beijing (CN); Cheng Li, Beijing (CN); Xiangdong Wei, Beijing (CN); An Seong Jun, Beijing (CN); Bongyeol Ryu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 123 days.

(21) Appl. No.: 14/316,429

(22) Filed: Jun. 26, 2014

(65) Prior Publication Data

US 2015/0227013 A1  Aug. 13, 2015

(30) Foreign Application Priority Data

Feb. 12, 2014  (CN) .......................... 2014 1 0048343

(51) Int. Cl.
*G02F 1/1362* (2006.01)
*H01L 27/12* (2006.01)

(52) U.S. Cl.
CPC .... *G02F 1/136286* (2013.01); *G02F 1/136209* (2013.01); *G02F 2001/136222* (2013.01); *H01L 27/124* (2013.01)

(58) Field of Classification Search
CPC .................. G02F 1/133512; G02F 1/136209; G02F 1/133514; G02F 1/136286; G02F 2001/136222; G02F 1/136227; G02F 2001/134318; G02F 2001/13629; G02F 2201/122; G02F 1/1345; H01L 27/124; H01L 29/78633; H01L 27/1214; H01L 27/1259; H01L 27/127; H01L 27/322; H01L 27/3248; H01L 29/4908; H01L 51/5284; H01L 29/41733; H01L 29/42384; H01L 51/56; H01L 27/3272

See application file for complete search history.

(56) References Cited

U.S. PATENT DOCUMENTS 8,848,142 B2 * 9/2014 Park .................. G02F 1/136209
                                                    349/110
2002/0154079 A1 * 10/2002 Shiota ............... G02F 1/134363
                                                    345/87

(Continued)

FOREIGN PATENT DOCUMENTS

CN         1936660 A       3/2007
CN       101097334 A       1/2008
CN       101251694 A       8/2008

OTHER PUBLICATIONS

Chinese Office Action and English translation dated Oct. 20, 2015, for corresponding Chinese Patent Application No. 201410048343.5.

(Continued)

*Primary Examiner* — Bac Au
(74) *Attorney, Agent, or Firm* — Kinney & Lange, P.A.

(57) ABSTRACT

Disclosed is a display substrate, including: a substrate; gate lines and data lines arranged in a crisscrossed pattern on the substrate; pixel units surrounded by the gate lines and the data lines, each of which includes a thin film transistor and a pixel electrode; a color filter layer disposed on the substrate and including at least one color region, a vertical projection of the pixel electrode within one of the pixel units on the substrate being within a vertical projection of one color region of the color filter layer on the substrate; and a black matrix disposed over the gate lines, the data lines and the thin film transistors, a vertical projection of all of the gate lines, the data lines and the thin film transistors on the substrate being within a vertical projection of the black matrix on the substrate.

13 Claims, 3 Drawing Sheets

(56) References Cited

U.S. PATENT DOCUMENTS

| | | | | |
|---|---|---|---|---|
| 2004/0125261 A1* | 7/2004 | Lee | G02F 1/136209 | 349/43 |
| 2004/0189904 A1* | 9/2004 | Kang | G02F 1/133536 | 349/114 |
| 2005/0122442 A1* | 6/2005 | Park | G02F 1/136227 | 349/43 |
| 2005/0270446 A1* | 12/2005 | Kim | G02F 1/136209 | 349/110 |
| 2008/0030640 A1 | 2/2008 | Hur et al. | | |
| 2009/0027601 A1* | 1/2009 | Kim | G02F 1/133514 | 349/106 |
| 2009/0250702 A1* | 10/2009 | Ma | H01L 27/1255 | 257/72 |
| 2012/0081641 A1* | 4/2012 | Noh | G02F 1/13394 | 349/106 |
| 2013/0155356 A1* | 6/2013 | Jang | G02F 1/1343 | 349/106 |

OTHER PUBLICATIONS

Second Chinese Office Action including English translation dated Feb. 22, 2016, for corresponding Chinese Application No. 201410048343.5.

* cited by examiner

DISPLAY SUBSTRATE AND METHOD OF MANUFACTURING THE SAME, AND DISPLAY DEVICE

CROSS-REFERENCE TO RELATED APPLICATION

This application claims the benefit of Chinese Patent Application No. 201410048343.5 filed on Feb. 12, 2014 in the State Intellectual Property Office of China, the whole disclosure of which is incorporated herein by reference.

BACKGROUND OF THE INVENTION

1. Field of the Invention

Embodiments of the present invention relate to field of display technique, in particular, to a display substrate and a method of manufacturing the same, and a display device.

2. Description of the Related Art

A display panel of a liquid crystal display (LCD) mainly includes an array substrate and a color filter substrate, wherein the array substrate is provided with gate lines and data lines arranged in a crisscrossed pattern. The gate lines and data lines encircle pixel units. Each of the pixel units includes a thin film transistor and a pixel electrode. The color filter substrate is provided with a black matrix and a color filter layer, wherein the color filter layer includes red regions, green regions and blue regions. A process for manufacturing the display panel includes steps of manufacturing the array substrate, manufacturing the color filter substrate, assembling the array substrate and the color filter substrate, and the like.

It has been found that an aligning error easily occurs when assembling the array substrate and the color filter substrate, which results in a poor display of the display device. Specifically, the aligning error occurs between the pixel electrodes on the array substrate and the color filter layer on the color filter substrate, such that the pixel electrode within one pixel unit on the array substrate directly faces a plurality of regions of different colors of the color filter layer on the color filter substrate, causing light passing through the pixel electrode to assume different colors and resulting in undesirable color mixing phenomenon in the display device. On the other hand, the aligning error also occurs between the gate lines, the data lines and thin film transistors on the array substrate and black matrix on the color filter substrate, such that the black matrix is not able to completely cover the gate lines, the data lines and the thin film transistors, resulting in undesirable phenomenon such as reduced transmittance and light leakage in the display device.

SUMMARY OF THE INVENTION

According to an embodiment of one aspect of the present invention, there is provided a display substrate, including: a substrate; gate lines and data lines arranged in a crisscrossed pattern on the substrate; pixel units surrounded by the gate lines and the data lines, each of the pixel units including a thin film transistor and a pixel electrode; a color filter layer disposed on the substrates and including at least one color region, a vertical projection of the pixel electrode within one of the pixel units on the substrate being within a vertical projection of one color region of the color filter layer on the substrate; and a black matrix disposed over the gate lines, the data lines and the thin film transistors, a vertical projection of all of the gate lines, the data lines and the thin film transistors on the substrate being within a vertical projection of the black matrix on the substrate.

According to an embodiment of another aspect of the present invention, there is provided a method of manufacturing a display substrate, including steps of: forming, on a substrate, a pattern including gate lines and data lines arranged in a crisscrossed pattern, thin film transistors and pixel electrodes, the thin film transistors and the pixel electrodes being disposed within pixel units surrounded by the gate lines and the data lines; and forming patterns of a color filter layer and a black matrix on the substrate, wherein, the color filter layer includes at least one color region, and a vertical projection of the pixel electrode within one of the pixel units on the substrate is within a vertical projection of one color region of the color filter layer on the substrate; and the black matrix is disposed on the gate lines, the data lines and the thin film transistors, a vertical projection of all of the gate lines, the data lines and the thin film transistors on the substrate is within a vertical projection of the black matrix on the substrate.

According to an embodiment of yet another aspect of the present invention, there is provided a display device including the above described display substrate.

BRIEF DESCRIPTION OF THE DRAWINGS

The above and other features of the invention will become more apparent by describing in detail exemplary embodiments thereof with reference to the accompanying drawings, in which.

DETAILED DESCRIPTION OF PREFERRED EMBODIMENTS OF THE INVENTION

Figure 1:
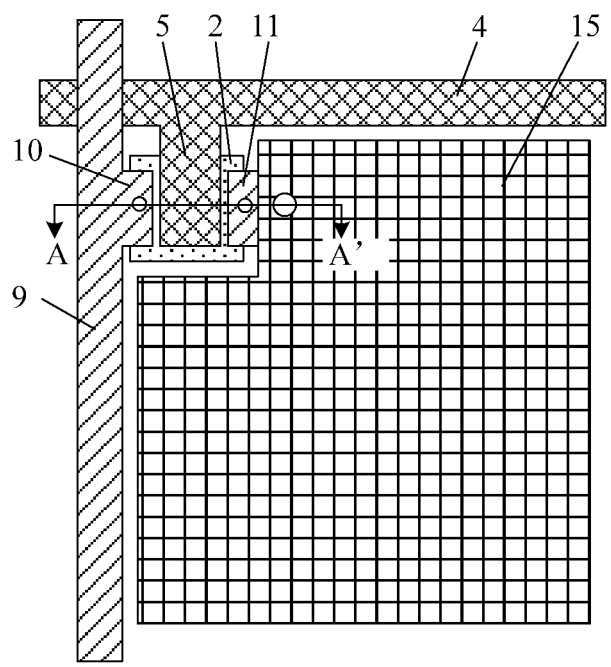
FIG. 1 is a structural schematic view showing a gate line, a data line, a thin film transistor and a pixel electrode in a display substrate according to one exemplary embodiment of the present invention.

Exemplary embodiments of the present invention will be described hereinafter in detail with reference to the attached drawings, wherein the like reference numerals refer to the like elements. The present invention may, however, be embodied in many different forms and should not be construed as being limited to the embodiment set forth herein; rather, these embodiments are provided so that the present invention will be thorough and complete, and will fully convey the concept of the disclosure to those skilled in the art.

According to a general inventive concept of the present invention, there is provided a display substrate, including: a substrate; gate lines and data lines arranged in a crisscrossed pattern on the substrate; pixel units surrounded by the gate lines and the data lines, each of the pixel units including a thin film transistor and a pixel electrode; a color filter layer disposed on the substrates and including at least one color region, a vertical projection of the pixel electrode within one of the pixel units on the substrate being within a vertical projection of one color region of the color filter layer on the substrate; and a black matrix disposed over the gate lines, the data lines and the thin film transistors, a vertical projection of all of the gate lines, the data lines and the thin film transistors on the substrate being within a vertical projection of the black matrix on the substrate.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A display substrate according to first exemplary embodiment of the present invention will be described below with respect to FIGS. 1-3. As shown in FIGS. 1 and 3, the display substrate includes a substrate 1, and gate lines 4 and data lines 4 arranged in a crisscrossed pattern on the substrate, the gate lines 4 and the data lines 9 surround pixel units, each of which includes a thin film transistor and a pixel electrode 15.

Figure 2:
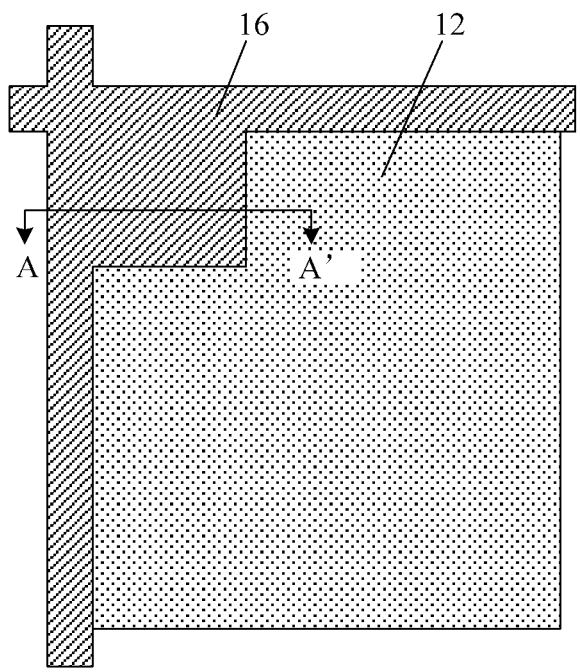
FIG. 2 is a schematic view of a black matrix and a color filter layer of the display substrate shown in FIG. 1 according to one exemplary embodiment of the present invention.
Figure 3:
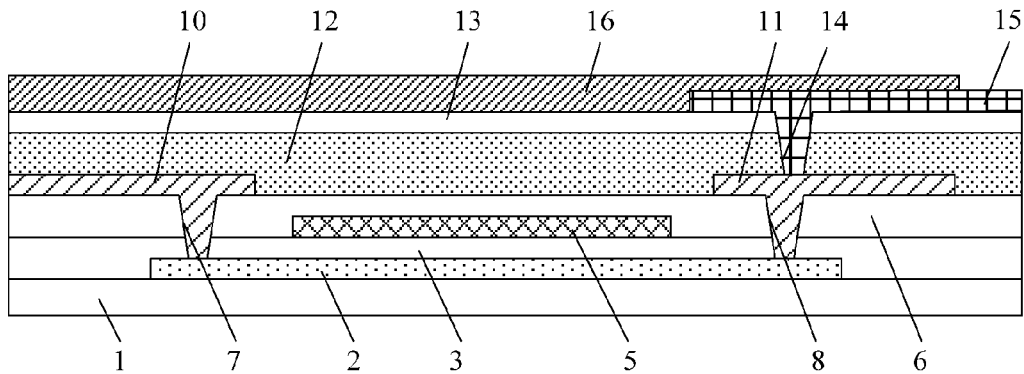
FIG. 3 is a sectional view of a display substrate taken along an A-A' line in FIG. 1 according to first exemplary embodiment of the present invention.

As shown in FIG. 2, the substrate 1 is further provided with a color filter layer 12 and a black matrix 16. The color filter layer 12 includes at least one color region, and a vertical projection of the pixel electrode 15 within one of the pixel units on the substrate 1 is within a vertical projection of one color region of the color filter layer 12 on the substrate 1. The black matrix 16 is disposed on the gate lines 4, the data lines 9 and the thin film transistors, and a vertical projection of all of the gate lines 4, the data lines 9 and the thin film transistors on the substrate 1 is within a vertical projection of the black matrix 16 on the substrate 1.

Note that, in order that the display substrate has a larger transmittance, in embodiments of the present invention, preferably, the vertical projection of all of the gate lines 4, the data lines 9 and the thin film transistors on the substrate 1 is within a vertical projection of the black matrix 16 on the substrate 1. Specifically, the vertical projection of the gate lines 4, the data lines 9 and the thin film transistors on the substrate 1 is completely overlapped with the vertical projection of the black matrix 16 on the substrate 1, or the vertical projection of the black matrix 16 on the substrate 1 is slightly larger than the vertical projection of the gate lines 4, the data lines 9 and the thin film transistors on the substrate 1.

The thin film transistor provided on the substrate 1 may be a bottom-gate type thin film transistor, or may also be a top-gate type thin film transistor. The thin film transistor in embodiments of the present invention is preferably a top-gate type thin film transistor, thereby avoiding a drift in a threshold voltage of the thin film transistor in use.

As shown in FIG. 3, the thin film transistor includes: an active layer 2 disposed on the substrate 1; a gate insulation layer 3 disposed on the active layer 2; a gate 5 disposed on the gate insulation layer 3, a source/drain insulation layer 6 disposed on the gate 5, and a source 10 and a drain 11 disposed on the source/drain insulation layer 6.

The substrate 1 is typically a glass substrate or quartz substrate having a good transmittance. The active layer 2 may be selected from polysilicon, amorphous silicon, monocrystalline silicon, metal oxide, metal oxide semiconductor material or the like. Further, a buffer layer may be provided between the substrate 1 and the active layer 2.

The gate insulation layer 3 is typically made of oxide, nitride or nitrogen oxide, or may be an insulating resin material.

The gate 5 is typically made of material selected from metal such as Cr, W, Ti, Ta, Mo, Al and Cu and alloy material thereof.

A first via 7 corresponding to the source 10 and a second via 11 corresponding to a drain 11 are provided in the gate insulation layer 3 and the source/drain insulation layer 6. The source/drain insulation layer 6 is typically made of oxide, nitride or nitrogen oxide, or may also be an insulating resin material.

The source 10 is connected with the active layer 2 through the first via 7, and the drain 11 is connected with the active layer 1 through the second via 8. The source 10 and the drain 11 are typically made of material selected from metal such as Cr, W, Ti, Ta, Mo, Al and Cu and alloy material.

Further, as shown in FIG. 3, the substrate 1 is further provided with: a color filter layer 12 disposed on the source 10 and the drain 11, a passivation layer 13 disposed on the color filter layer 12, a pixel electrode 15 disposed on the passivation layer 13, and a black matrix 16 disposed on the pixel electrode 15.

The color filter layer 12 may include a red region, a green region and a blue region, each of which is made of photosensitive resin of corresponding color.

A third via 14 is provided in the color filter layer 12 and the passivation layer 13 to correspond to the drain 11 and the pixel electrode 15. The passivation layer 13 is typically made of material selected from oxide, nitride, or nitrogen oxide, or an insulating resin material.

The pixel electrode 15 is electrically connected with the drain 11 through the third via 14. The pixel electrode 15 is typically made of transparent conductive material such as ITO, IZO, etc.

The black matrix 16 is typically made of black resin which has a good light shielding performance and is not reflective.

Figure 4:
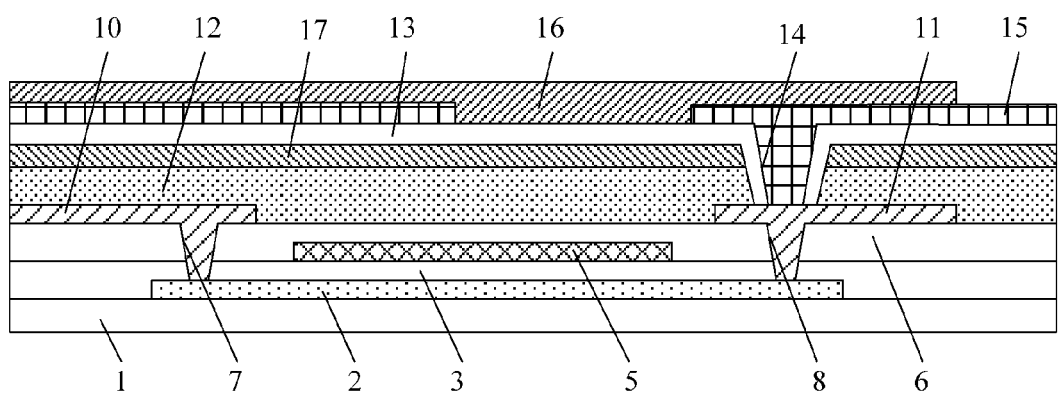
FIG. 4 is a sectional view of a display substrate taken along an A-A' line in FIG. 1 according to second exemplary embodiment of the present invention.

FIG. 4 is a sectional view of a display substrate taken along an A-A' line in FIG. 1 according to second exemplary embodiment of the present invention.

An Advanced Super Dimension Switching (ADSDS) technique can be applied to improve display effect of the display device. As shown in FIG. 4, a common electrode 17 is further provided on the substrate 1 between the color filter layer 12 and the passivation layer 13. In such a case, a slit may be provided in the pixel electrode 15, that is, a pixel electrode 15 having a slit is formed. Of course, each pixel electrode 15 may also be a strip electrode, and the projections of the pixel electrode 15 and the common electrode 17 on the substrate 1 may be overlapped with each other or interleaved with each other. Further, the common electrode 17 may be provided with a slit, or both the pixel electrode 15 and the common electrode 17 are provided with slits. Liquid crystal molecules are rotated and orientated to perform a display through a horizontal electric field generated by the pixel electrode 15 and the common electrode 17 in the same plane. The present invention, however, is not limited to this. Note that, in this circumstance, the passivation layer 13 is provided on an inner side of the third via 14, so that a short circuit will not occur between the pixel electrode 15 and the common electrode 17 when the pixel electrode 15 is electrically connected with the drain 11 through the third via 14.

It should be noted that, positional relationship of the above respective parts are not restrictive, as long as a vertical projection of the pixel electrode 15 within one pixel unit on the substrate 1 is within a vertical projection of one color region of the color filter layer 12 on the substrate 1, and the black matrix 16 is disposed over the gate lines 4, the data lines 9 and the thin film transistors, and the projection of all of the gate lines 4, the data lines 9 and the thin film transistors on the substrate 1 is within a vertical projection of the black matrix 16 on the substrate 1. As an exemplary embodiment, the color filter layer 12 and black matrix 16 may be disposed in the same layer. However, when applying the Advanced Super Dimension Switching technique, a separate insulation layer needs to be formed between the data lines 9, the sources 10 and the drains 11, and the common electrode 17. Further, the display substrate may include other structures as actually required, which is not limited in the embodiments of the present invention.

In the display substrate provided by the above embodiment of the present invention, the gate lines 4, the data lines 9, the thin film transistors and the pixel electrodes 15 are provided on the substrate 1, while the black matrix 16 and the color filter layer 12 are also provided on the substrate 1, thereby avoiding the aligning error between the color filter substrate and the array substrate occurring in the prior art. The color filter layer 12 includes at least one color region, and a vertical projection of the pixel electrode 15 within one pixel unit on the substrate is within a vertical projection of one color region of the color filter layer 12 on the substrate, so that light passing through the pixel electrode will only assume one color, thus no color mixing phenomenon occurs in the display device with such a display substrate. The black matrix 16 is disposed over the gate lines 4, the data lines 9 and the thin film transistors, and the vertical projection of all of the gate lines 4, the data lines 9 and the thin film transistors on the substrate 1 is within a vertical projection of the black matrix 16 on the substrate 1, so that the black matrix 16 can completely cover the gate lines 4, the data lines 9 and the thin film transistors, thus there is no reduced transmittance and light leakage in the display device with such a display substrate.

An embodiment of the present invention further provides a display device including the above display substrate. The above display substrate may be used as an array substrate, a bare glass substrate (not shown), which is not provided with other structures thereon, is provided and assembled with the above display substrate, and then liquid crystal is injected, so that a liquid crystal display panel can be formed to manufacture a display device. It can be understood by those skilled in the art that the display device may also include other structures, the description of which will be omitted. The display device may be a liquid crystal panel, an e-paper, an OLED panel, a mobile phone, a tablet computer, a television, a display, a notebook, a digital photo frame, a navigator, or any other products or components having a display function.

A method of manufacturing a display substrate according to an exemplary embodiment of the present invention will be described below.

Figure 5:
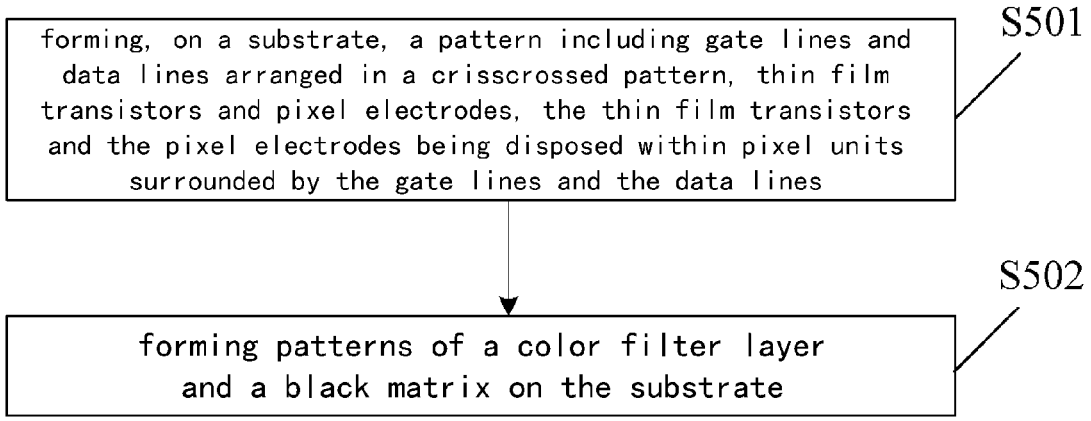
FIG. 5 is a flow chart showing a method of manufacturing a display substrate according to one exemplary embodiment of the present invention.

FIG. 5 is a flow chart showing a method of manufacturing a display substrate according to one exemplary embodiment of the present invention. As shown in FIG. 5, the method includes:

Step S501: forming, on a substrate, a pattern including gate lines and data lines arranged in a crisscrossed pattern, thin film transistors and pixel electrodes, the thin film transistors and the pixel electrodes being disposed within pixel units surrounded by the gate lines and the data lines; and Step S502: forming a patterns of a color filter layer and a black matrix on the substrate.

The color filter layer 12 includes at least one color region, and a vertical projection of the pixel electrode 15 within one of the pixel units on the substrate 1 is within a vertical projection of one color region of the color filter layer 12 on the substrate 1.

The black matrix 16 is disposed over the gate lines 4, the data lines 9 and the thin film transistors, a vertical projection of all of the gate lines 4, the data lines 9 and the thin film transistors on the substrate 1 is within a vertical projection of the black matrix 16 on the substrate 1.

Figure 6:
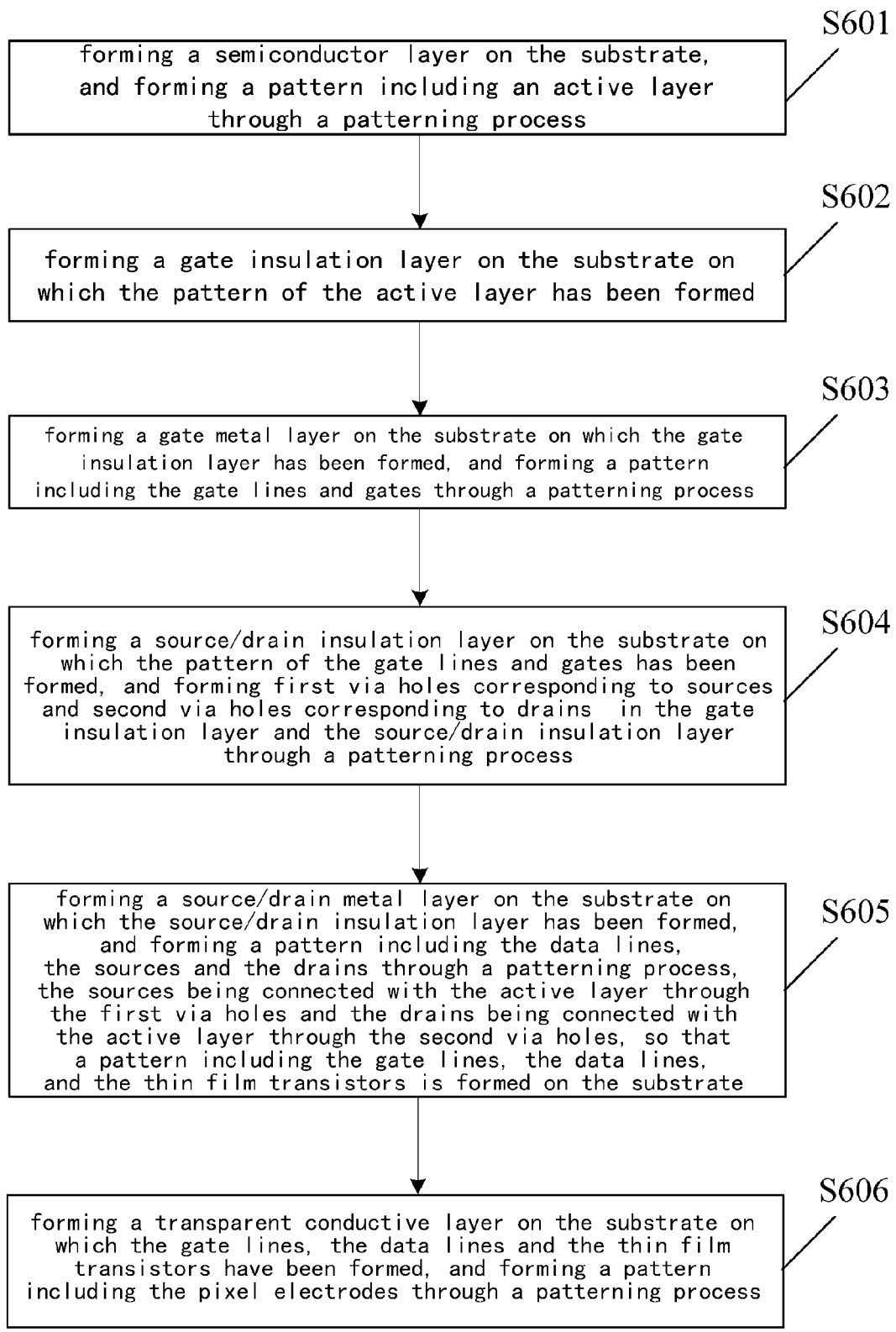
FIG. 6 is a specific flow chart of step S501 in FIG. 5.

As shown in FIG. 6, the step S501 includes following steps:

Step S601: forming a semiconductor layer on the substrate 1 and forming a pattern including an active layer 2 through a patterning process.

First, a semiconductor layer is formed on the substrate 1 through a process such as plasma activated chemical vapor deposition.

Then, a layer of photoresist is coated on the semiconductor layer, a mask plate having a pattern including the active layer 2 is used to cover the semiconductor layer on which the photoresist is coated, and the pattern including the active layer 2 is formed after exposure, developing, etching and the like.

Step S602: a gate insulation layer 3 is formed on the substrate 1 on which the pattern of the active layer 2 has been formed.

The gate insulation layer 3 is formed on the substrate 1 on which the pattern of the active layer 2 has been formed through a process such as plasma enhanced chemical vapor deposition, sputtering or thermal evaporation.

Step S603: a gate metal layer is formed on the substrate 1 on which the gate insulation layer 3 has been formed, and a pattern including the gate line 4 and gate 5 is formed through a patterning process.

First, a gate metal layer is formed on the substrate 1 on which the gate insulation layer 3 has been formed through a process such as plasma enhanced chemical vapor deposition, sputtering or thermal evaporation.

Then, a layer of photoresist is coated on the gate metal layer, a mask plate having a pattern including the gate line 4 and gate 5 is used to cover the gate metal layer on which the photoresist is coated, and the pattern including gate line 4 and gate 5 is formed after exposure, developing, etching and the like.

Step S604: a source/drain insulation layer 6 is formed on the substrate 1 on which the pattern of the gate line 4 and gate 5 have been formed, and a first via 7 corresponding to a source 10 and a second via 11 corresponding to a drain 11 are provided in the gate insulation layer 3 and the source/drain insulation layer 6 through a patterning process.

First, a source/drain insulation layer 6 is formed on the substrate 1, on which the pattern of the gate line 4 and gate 5 have been formed, through a process such as plasma enhanced chemical vapor deposition, sputtering or thermal evaporation.

Then, a layer of photoresist is coated on the source/drain insulation layer 6; a mask plate having a pattern including the first via 7 and the second via 8 is used to cover the source/drain insulation layer 6 on which the photoresist is coated, and the pattern of the first via 7 corresponding to the source 10 and the second via 11 corresponding to the drain 11 is provided in the gate insulation layer 3 and the source/drain insulation layer 6 after exposure, developing, etching and the like.

Step S605: a source/drain metal layer is formed on the substrate 1 on which the source/drain insulation layer 6 has been formed, and a pattern including the data lines 9, the sources 10 and the drains 11 is formed through a patterning process, wherein the source 10 is connected with the active layer 2 through the first via 7 and the drain 11 is connected with the active layer 2 through the second via 8, so that the pattern of the gate lines 4, the data lines 9 and the thin film transistors is formed.

First, a source/drain metal layer is formed on the substrate 1 on which the source/drain insulation layer 6 has been formed through a process such as plasma enhanced chemical vapor deposition, sputtering or thermal evaporation.

Then, a layer of photoresist is coated on the source/drain metal layer, and a mask plate having a pattern including the data lines 9, the sources 10 and the drains 11 is used to cover the source/drain metal layer on which the photoresist is coated, and the pattern of data lines 9, the sources 10 and the drains 11 is formed after exposure, developing, etching and the like, wherein the source 10 is connected with the active layer 2 through the first via 7 and the drain 11 is connected with the active layer 2 through the second via 8, so that the pattern of the gate lines 4, the data lines 9 and the thin film transistors is formed.

The step of forming the pattern of the color filter layer 12 on the substrate 1 includes forming the pattern of the color filter layer 12 on the substrate 1 on which the pattern of the gate lines 4, the data lines 9 and the thin film transistors has been formed, the color filter layer 12 includes at least one color region.

In one particular embodiment, in the step of forming the pattern of the color filter layer 12 on the substrate 1, a method such as inkjet printing, pigment dispersion, printing or the like may be used to form pattern of the color filter layer 12 on the substrate 1 on which the pattern of the gate lines 4, the data lines 9 and the thin film transistors has been formed. Exemplarily, when the color filter layer 12 includes a red region, a green region and a blue region, it should be formed at three times. Exemplarily, the red region is firstly formed, where a layer of red photosensitive resin is coated on the substrate and covered by a corresponding mask plate, and exposure and developing are performed to form the red region; then, the green region is formed, where a layer of green photosensitive resin is coated on the substrate and covered by a corresponding mask plate, and exposure and developing are performed to form the green region; finally, the blue region is formed, where a layer of blue photosensitive resin is coated on the substrate and covered by a corresponding mask plate, and exposure and developing are performed to form the blue region. After this, the pattern of the color filter layer 12 is formed on the substrate 1 on which the pattern of the gate lines 4, the data lines 9 and the thin film transistors has been formed.

The method of manufacturing the display substrate further includes steps: on the substrate on which the pattern of the color filter layer 12 has been formed, forming a passivation layer 13 through a process such as plasma enhanced chemical vapor deposition, sputtering or thermal evaporation, and forming a pattern of a third via, which corresponds to the drain 11 and the pixel electrode 15, on the patterns of the passivation layer 13 and the color filter layer 12 through a patterning process.

The above step S501 further includes Step S606 of: forming a transparent conductive layer on the substrate 1 on which the passivation layer 13 has been formed, and forming a pattern including the pixel electrode 15 through a patterning process. The transparent conductive layer may be formed on substrate 1 on which the passivation layer 13 has been formed through a process such as deposition, sputtering, coating, or the like.

The step of forming the pattern including the pixel electrode 15 through a patterning process includes: coating photoresist on the transparent conductive layer, covering the transparent conductive layer on which the photoresist has been coated by a mask plate having a pattern including the pixel electrode 15, and forming the pattern of the pixel electrode 15 after exposure, developing, etching and the like.

In one specific example, the step of forming the pattern of the third via 14, which corresponds to the drain 11 and the pixel electrode 15, on the patterns of the passivation layer 13 and the color filter layer 12 through a patterning process includes: coating photoresist on the passivation layer 13, covering the passivation layer 13 on which the photoresist has been coated by a mask plate having a pattern including the third via 14, and forming the pattern of the third via 14 corresponding to the drain 11 and pixel electrode 15 after exposure, developing, etching and the like.

Step of forming a pattern of a black matrix 16 on the substrate 1 on which the pixel electrode 15 has been formed will be described below in detail. A method such as inkjet printing, pigment dispersion, printing or the like may be used to form the black matrix 16 on the substrate 1 on which the pixel electrode 15 has been formed. Exemplarily, first, a layer of black photosensitive resin is coated. Then, a mask plate having the pattern of the black matrix 16 to cover the black photosensitive resin, and the pattern of the black matrix 16 is formed on the substrate 1 on which the pixel electrode 15 has been formed after exposure, developing, etching and the like.

An Advanced Super Dimension Switching technique can be applied to improve display effects of the display device. For this purpose, in the above method, a pattern of a common electrode 17 is formed on the substrate 1 on which the pattern of the color filter layer 12 has been formed before forming the passivation layer 13, and the common electrode is formed between the color filter layer 12 and the passivation layer 13. A slit may be provided in the pixel electrode 15, or in both of the pixel electrode 15 and the common electrode 17, which is not limited in embodiments of the present invention.

Specifically, the pattern of the common electrode 17 may be formed between the color filter layer 12 and passivation layer 13 through a process such as deposition, sputtering, coating, or the like. After forming the pattern of the common electrode 17, firstly, the pattern of the third via 14, which corresponds to the drain 11 and the pixel electrode 15, should be formed on the patterns of the passivation layer 13 and the color filter layer 12 through one patterning process; then, the passivation layer 13 is formed on the pattern of the common electrode 17; Subsequently, only the passivation layer 13 on bottom of the third via 14 is etched off while the passivation layer 13 on an inner side of the third via 14 is remained; finally, the pattern of the pixel electrode 15 is formed on the passivation layer 13. The pixel electrode 15 is electrically connected with the drain 11 through the third via 14, so that a short circuit will not occur between the pixel electrode 15 and the common electrode 17.

In the method of manufacturing the display substrate provided according to an embodiment of the present invention, the gate lines, the data lines, thin film transistors, the pixel electrodes, the black matrix and the color filter layer are made on the same substrate, thereby avoiding the aligning error between the color filter substrate and the array substrate. The formed color filter layer includes at least one color region, and a vertical projection of the pixel electrode within one of the pixel units on the substrate is only within a vertical projection of one color region of the color filter layer on the substrate, so that light passing through the pixel electrode will only assume one color, thus no color mixing phenomenon occurs in the display device with such a display substrate. The formed black matrix is disposed over the gate lines, the data lines and the thin film transistors, and a vertical projection of all of the gate lines, the data lines and the thin film transistors on the substrate is within a vertical projection of the black matrix on the substrate, so that the black matrix can completely cover the gate lines, the data lines and the thin film transistors, thus no reduced transmittance and light leakage will occur in the display device with such a display substrate.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A display substrate, including:
a substrate;
gate lines and data lines arranged in a crisscrossed pattern on the substrate;
pixel units defined by the gate lines and the data lines, each of which includes a thin film transistor and a pixel electrode;
a color filter layer disposed on the substrate and including at least one color region, a vertical projection of the pixel electrode within one of the pixel units on the substrate being within a vertical projection of one color region of the color filter layer on the substrate; and
a black matrix disposed over the gate lines, the data lines and the thin film transistors, a vertical projection of all of the gate lines, the data lines and the thin film transistors on the substrate being within a vertical projection of the black matrix on the substrate;
wherein the thin film transistor comprises:
an active layer disposed on the substrate;
a gate insulation layer disposed on the active layer;
a gate disposed on the gate insulation layer;
a source/drain insulation layer disposed on the gate, a first via corresponding to a source and a second via corresponding to a drain being provided in the gate insulation layer and the source/drain insulation layer; and
the source and the drain disposed on the source/drain insulation layer, the source being connected with the active layer through the first via, and the drain being connected with the active layer through the second via;
and wherein:
the color filter layer is disposed over the source and the drain;
a passivation layer is further provided on the color filter layer on the substrate, and a third via corresponding to the drain and the pixel electrode is provided in the color filter layer and the passivation layer;
the pixel electrode is disposed on the passivation layer and is electrically connected with the drain through the third via; and
the black matrix is disposed over the pixel electrode.

2. The display substrate according to claim 1, wherein:
a common electrode is further provided on the substrate between the color filter layer and the passivation layer; and
a slit is provided in the pixel electrode.

3. The display substrate according to claim 1, wherein:
a common electrode is further provided on the substrate between the color filter layer and the passivation layer; and
the pixel electrode is a strip electrode.

4. The display substrate according to claim 1, wherein:
the black matrix and the color filter layer are disposed in the same layer.

5. A display device, including the display substrate according to claim 1.

6. The display device according to claim 5, wherein:
a common electrode is further provided on the substrate between the color filter layer and the passivation layer; and
a slit is provided in the pixel electrode.

7. The display device according to claim 5, wherein:
a common electrode is further provided on the substrate between the color filter layer and the passivation layer; and
the pixel electrode is a strip electrode.

8. The display device according to claim 5, wherein:
the black matrix and the color filter layer are disposed in the same layer.

9. The display device according to claim 5, wherein:
the display device further includes a bare glass substrate, the bare glass substrate is adapted to be assembled with the display substrate, and liquid crystal is received within a space defined by the bare glass substrate and the display substrate.

10. A method of manufacturing a display substrate, including steps of:
forming, on a substrate, a pattern including gate lines and data lines arranged in a crisscrossed pattern, thin film transistors and pixel electrodes, the thin film transistors and the pixel electrodes being disposed within pixel units defined by the gate lines and the data lines; and
forming patterns of a color filter layer and a black matrix on the substrate,
wherein,
the color filter layer includes at least one color region, and a vertical projection of the pixel electrode within one of the pixel units on the substrate is within a vertical projection of one color region of the color filter layer on the substrate; and
the black matrix is disposed over the gate lines, the data lines and the thin film transistors, and a vertical projection of all of the gate lines, the data lines and the thin film transistors on the substrate is within a vertical projection of the black matrix on the substrate;
wherein the step of forming, on the substrate, the pattern including gate lines and data lines arranged in a crisscrossed pattern, thin film transistors and pixel electrodes includes steps of:
forming a semiconductor layer on the substrate, and forming a pattern including an active layer through a patterning process;
forming a gate insulation layer on the substrate on which the pattern of the active layer has been formed;
forming a gate metal layer on the substrate on which the gate insulation layer has been formed, and forming a pattern including the gate lines and gates through a patterning process;
forming a source/drain insulation layer on the substrate on which the pattern of the gate lines and gates have been formed, and forming first vias corresponding to sources and second vias corresponding to drains in the gate insulation layer and the source/drain insulation layer through a patterning process; and
forming a source/drain metal layer on the substrate on which the source/drain insulation layer has been formed, and forming a pattern including the data lines, the sources and the drains through a patterning process, the sources being connected with the active layer through the first vias and the drains being connected with the active layer through the second vias, so that the pattern of the gate lines, the data lines and the thin film transistors is formed;

the method further including steps of:
- on the substrate on which the pattern of the color filter layer has been formed, forming a passivation layer, and forming a pattern of third vias, which correspond to the drains and the pixel electrodes, on the pattern of the passivation layer and the color filter layer through a patterning process; and
- before forming the passivation layer, forming a pattern of a common electrode on the substrate on which the pattern of the color filter layer has been formed, the common electrode being formed between the color filter layer and the passivation layer.

11. The method according to claim 10, wherein:
the step of forming the pattern of the color filter layer on the substrate includes forming the pattern of the color filter layer on the substrate on which the pattern of the gate lines, the data lines and the thin film transistors has been formed; and
the step of forming, on the substrate, the pattern including gate lines and data lines arranged in a crisscrossed pattern, thin film transistors and pixel electrodes further includes steps of forming a transparent conductive layer on the substrate on which the passivation layer has been formed, and forming a pattern including the pixel electrodes through a patterning process.

12. The method according to claim 11, wherein the step of forming the pattern of the black matrix on the substrate includes steps of:
forming the pattern of the black matrix on the substrate on which the pattern of the pixel electrodes has been formed.

13. The method according to claim 10, wherein after forming the pattern of the common electrode, the method includes steps of:
- forming the pattern of the third vias, which correspond to the drains and pixel electrodes, in the common electrode and color filter layer through one patterning process;
- forming the passivation layer on the pattern of the common electrode, and then only etching off the passivation layer on bottoms of the third vias with the passivation layer on inner sides of the third vias being remained; and
- forming a pattern of pixel electrodes on the passivation layer, pixel electrodes being electrically connected with the drains through the third vias.

\* \* \* \* \*